United States Patent
Kwon et al.

(10) Patent No.: US 8,669,126 B2
(45) Date of Patent: Mar. 11, 2014

(54) UNIFORM COATING METHOD FOR LIGHT EMITTING DIODE

(75) Inventors: Sung Hoon Kwon, Seoul (KR); Young Joon Choi, Seoul (KR); Sang Kwon Han, Seoul (KR); Ji Sung Jang, Seoul (KR); Su Eun Chung, Seoul (KR)

(73) Assignee: SNU R&DB Foundation, Seoul (KR)

( * ) Notice: Subject to any disclaimer, the term of this patent is extended or adjusted under 35 U.S.C. 154(b) by 0 days.

(21) Appl. No.: 13/435,342

(22) Filed: Mar. 30, 2012

(65) Prior Publication Data

US 2013/0260489 A1 Oct. 3, 2013

(51) Int. Cl.
*H01L 21/00* (2006.01)

(52) U.S. Cl.
USPC .................. 438/27; 438/28; 438/29

(58) Field of Classification Search
CPC . H01L 33/50; H01L 2933/0041; H01L 33/52; H01L 33/56; H01L 2933/005; H01L 33/44; H01L 2933/0025
USPC ...................................... 438/26–29
See application file for complete search history.

(56) References Cited

U.S. PATENT DOCUMENTS

| | | | |
|---|---|---|---|
| 2009/0020779 A1* | 1/2009 | Yamada et al. | 257/100 |
| 2010/0276716 A1* | 11/2010 | Kwon et al. | 257/98 |
| 2013/0005077 A1* | 1/2013 | Meng et al. | 438/99 |

FOREIGN PATENT DOCUMENTS

| | | |
|---|---|---|
| JP | 2001-135861 A | 5/2001 |
| JP | 2004-048067 A | 2/2004 |
| JP | 2009-010109 A | 1/2009 |
| KR | 10-2009-0076101 A | 7/2009 |

OTHER PUBLICATIONS

Erik T. Donhowe, UV Curable Coatings in Aluminum Can Production 1-6 (1994).*

* cited by examiner

*Primary Examiner* — Anthony Ho
(74) *Attorney, Agent, or Firm* — Sherr & Jiang, PLLC (57) ABSTRACT

A method of coating a light emitting diode (LED) is provided. The method includes preparing a substrate in which a plurality of LEDs are arranged, applying a curable liquid containing a fluorescent material to the substrate and the plurality of LEDs, and selectively applying energy to the substrate to which the curable liquid is applied, to thereby pattern the curable liquid, wherein the application of the energy includes applying the energy to both surfaces of the substrate.

8 Claims, 12 Drawing Sheets

UNIFORM COATING METHOD FOR LIGHT EMITTING DIODE

TECHNICAL FIELD

The described technology relates generally to methods of coating a light emitting diode (LED), particularly to methods for forming a uniform fluorescent coating around an LED by improving the exposure process.

BACKGROUND

Conventional art for coating an LED with a fluorescent material using an exposure apparatus includes a method of applying a polymer material such as epoxy, into which the fluorescent material is mixed, onto the LED, and then curing the polymer material. In general, a packaging process is performed by applying a fluorescent material to the entire surface of the LED after completion of wire bonding. Therefore, when the LED coated with the fluorescent material does not have desired performance, the LED, into which a high manufacturing cost has been invested because the wire bonding process was already performed, should be disposed of, and thus the overall manufacturing cost may be increased.

In addition, in the conventional method of coating an LED with a fluorescent material, it may be difficult to control the thickness of the polymer material containing the fluorescent material. To resolve those problems, Korea Patent Publication No. 10-2009-0076101 discloses technology for controlling the coating thickness of a photoresist containing a fluorescent material by applying a photoresist including the fluorescent material onto a substrate on which LED chips are arranged, and then selectively exposing the photoresist.

SUMMARY

In one embodiment, a method of coating a light emitting diode (LED) is provided. The method includes preparing a substrate on which a plurality of LEDs are arranged, applying a curable liquid containing a fluorescent material onto the substrate and the plurality of LEDs, and selectively applying energy to the substrate to which the curable liquid is applied, to thereby pattern the curable liquid, wherein the application of the energy includes applying the energy to both surfaces of the substrate.

In an example embodiment, the patterning is performed to form a fluorescent coating of a predetermined thickness on each surface of the plurality of LEDs.

In an example embodiment, the application of the energy is preformed by placing first and second energy application parts above and below upper and lower surfaces of the substrate, respectively, to apply the energy to the upper and lower surfaces of the substrate simultaneously or sequentially.

In an example embodiment, the application of the energy is performed after symmetrically aligning first and second masks having mirror images to each other on both surfaces of the substrate.

In an example embodiment, the application of the energy is performed using an energy application part placed over one surface of the substrate, and then performed by rotating the substrate such that the other surface of the substrate faces the energy application part or by moving the energy application part over the other surface of the substrate.

In an example embodiment, the application of the energy is performed by aligning a first mask on one surface of the substrate to perform a primary exposure, and then aligning a second mask having a mirror image to the first mask on the other surface of the substrate to perform a secondary exposure.

In an example embodiment, the application of the curable liquid is performed by disposing the substrate and a board parallel to each other, with the plurality of LEDs sandwiched therebetween, and introducing the curable liquid between the substrate and board.

In an example embodiment, the application of the energy is performed through a maskless lithography method.

In an example embodiment, the application of the energy is performed by applying more energy to the lower surface of the substrate than to the upper surface of the substrate having the plurality of LEDs positioned thereon.

The Summary is provided to introduce a selection of concepts in a simplified form that are further described below in the Detailed Description. The Summary is not intended to identify key features or essential features of the claimed subject matter, nor is it intended to be used as an aid in determining the scope of the claimed subject matter.

BRIEF DESCRIPTION OF THE DRAWINGS

The above and other features and advantages of the present disclosure will become more apparent to those of ordinary skill in the art by describing in detail example embodiments thereof with reference to the attached drawings in which.

DETAILED DESCRIPTION

It will be readily understood that the components of the present disclosure, as generally described and illustrated in the Figures herein, could be arranged and designed in a wide variety of different configurations. Thus, the following more detailed description of the embodiments of apparatus and methods in accordance with the present disclosure, as represented in the Figures, is not intended to limit the scope of the disclosure, as claimed, but is merely representative of certain examples of embodiments in accordance with the disclosure. The presently described embodiments will be best understood by reference to the drawings, wherein like parts are designated by like numerals throughout. Moreover, the drawings are not necessarily to scale, and the sizes and relative sizes of the layers and regions may have been exaggerated for clarity.

It will also be understood that when an element or layer is referred to as being "on," another element or layer, the element or layer may be directly on the other element or layer or intervening elements or layers may be present. As used herein, the term "and/or" may include any and all combinations of one or more of the associated listed items.

FIGS. 1 to 4 are diagrams illustrating a method of coating a light emitting diode (LED) using a curable liquid containing a fluorescent material according to an embodiment of the present invention.

Figure 1:
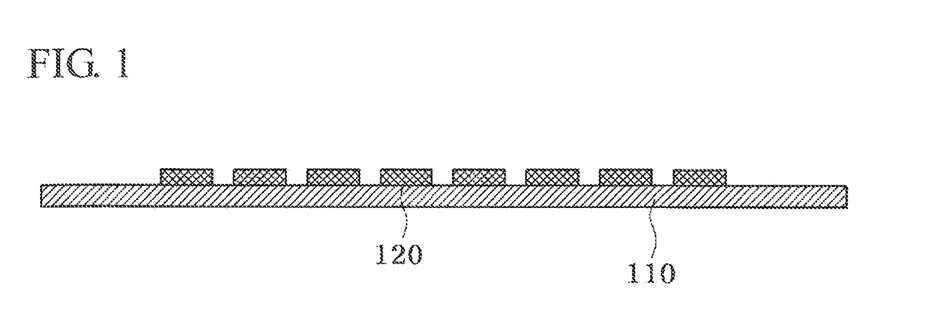
FIGS. 1 to 4 are diagrams illustrating a method of coating a light emitting diode (LED) using a curable liquid containing a fluorescent material according to an embodiment of the present invention.

In FIG. 1, a substrate 110 on which a plurality of LEDs 120 are arranged is prepared. The substrate 110 is not particularly limited, and various kinds of substrates can be used as long as the substrate can transmit energy such as ultraviolet (UV) rays and pass the energy to an area to be patterned, for a double-side lithography process to be described later. For example, the substrate 110 may be made of a transparent or translucent material so that ultraviolet rays can penetrate. Particularly, the substrate 110 may be a glass substrate, a plastic substrate, or blue tape. Various kinds of LEDs can be used as the plurality of LEDs 120. The plurality of LEDs 120, for example, may include at least one of a blue LED, a red LED, a green LED, and a UV LED.

Figure 2:
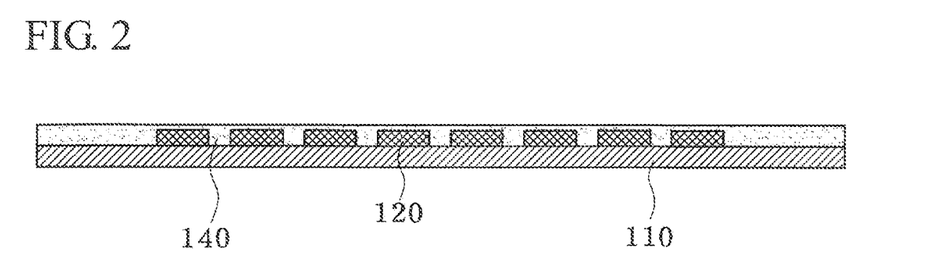

In FIG. 2, a curable liquid 140 containing a fluorescent material is applied onto the substrate 110 and the plurality of LEDs 120. The curable liquid 140 refers to a material which is cured in response to light, electron beams, and various other energy sources, and various kinds of materials can be used as the curable liquid. For example, the curable liquid 140 may be a photoresist or include a silicon compound having a cross-linkable moiety. In the latter case, the curable liquid 140 may be a mixture of cross-linkable material such as polyethylene glycol diacrylate (PEG-DA) and a known photoinitiator. In another example, the curable liquid 140 may be a known material or mixture that is cured by irradiating visible light, infrared light, ultraviolet light, or other energy. Various types of fluorescent materials can be used, for example, at least one selected from a red fluorescent material, a green fluorescent material, a blue fluorescent material, a yellow fluorescent material, and combinations thereof.

The application of the curable liquid 140 may be performed through various methods. For example, the application of the curable liquid 140 may be performed through a method of immersing the substrate 110 with the plurality of LEDs 120 arranged thereon in the curable liquid 140. In another example, the application of the curable liquid 140 may be performed by spraying the curable liquid 140 onto the substrate 110. In another example, the application of the curable liquid 140 may be performed using a spin coater.

Figure 3:
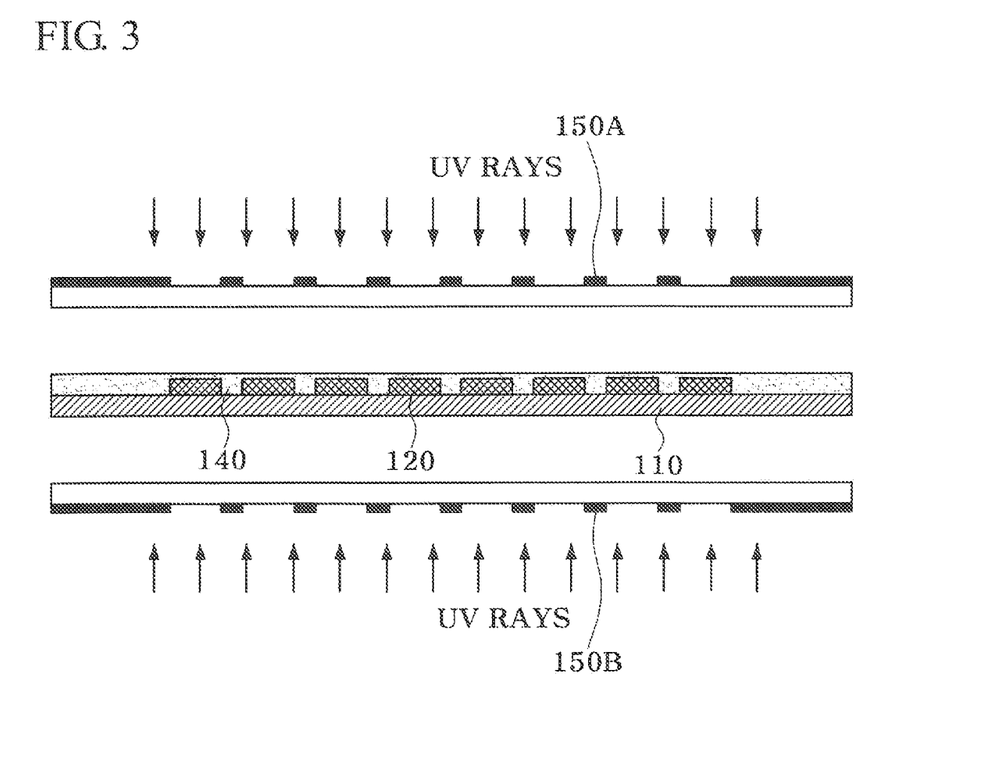

In FIG. 3, the curable liquid 140 is patterned by selectively applying energy to the substrate 110 to which the curable liquid 140 is applied. The application of energy may be performed by simultaneously or sequentially irradiating energy to both sides of the substrate 110. The energy source for applying energy may be one selected from the group consisting of UV rays, heat, visible light, infrared rays, and electron beams. The application of energy may be performed by simultaneously applying energy to both sides of the substrate 110 to which the curable liquid 140 is applied, or sequentially applying energy to each side of the substrate 110, as shown in FIG. 3. That is, energy may be first applied to one side of the substrate 110, and then to the other side of the substrate 110. Masks 150A and 150B are arranged in a mirror image to each other. Thus, a uniform fluorescent coating 142 can be formed by applying energy to the same area around the LEDs 120.

Although FIG. 3 only shows an example of selectively applying light to the curable liquid 140 using the masks 150A and 150B, any other method such as maskless lithography can be used as long as the light can be selectively provided to the curable liquid 140. A system that implements the maskless lithography system may include a light source, a spatial optical modulator, and a reduction lens. For example, a constant pattern can be obtained by adjusting the tilt of each mirror that configures a spatial optical modulator such as a digital micro-mirror array. Also, some of the light provided from the light source is blocked, and the remaining light can be provided to the substrate 110 on which the curable liquid 140 is coated through the reduction lens. It will be understood, throughout this specification, that the term "mask" refers not only to a conventional "static mask," but also to a "dynamic mask" used in maskless lithography. When a dynamic mask is used, the manufacturing cost can be saved and a desired pattern can be more easily obtained.

Although the drawings show the application of UV rays as energy, the energy is not construed as limited to a particular type of energy. Although the drawings show the use of a negative photoresist as the curable liquid 140, a positive photoresist can be used. When a positive photoresist is used, unlike the drawings, the mask 150 is fabricated so that the light is blocked from the area in which the coating 142 is formed and transmitted to the other areas.

Figure 4:
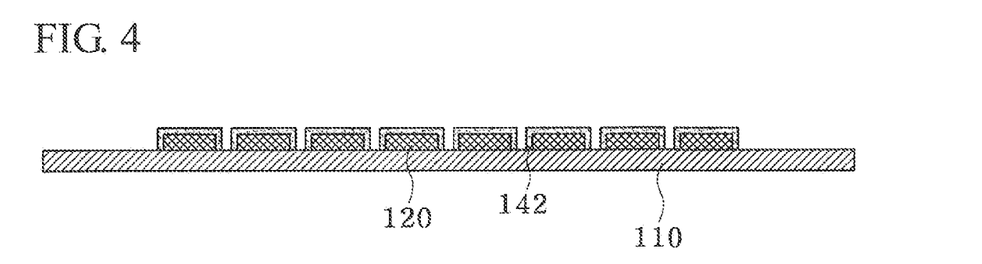

Referring to FIG. 4, the fluorescent coating 142 having a constant thickness is formed on each surface of the plurality of LEDs 120 by developing the curable liquid 140. The fluorescent coating 142 corresponds to the cured curable liquid 140 including the fluorescent material.

When the LEDs are coated according to the method of the embodiment of the present invention, the fluorescent coating on the LED can be patterned, and therefore, wire bonding may be performed after the coating process. In addition, when the LEDs are coated according to the method of the embodiment of the present invention, a plurality of LEDs can be simultaneously coated, and therefore, the cost of the coating process can be reduced. Furthermore, when the LEDs are coated according to the method of the embodiment of the present invention, because the coating thickness on the sidewalls of the LEDs can be controlled, the color of light emitted from the sidewalls of the LEDs may be adjusted more accurately. Even if a failure occurs during wire bonding process following the coating process, it is a failure at the chip state in which additional processes have not been performed yet, and thus the cost caused by the failure can be significantly reduced.

Figure 5:
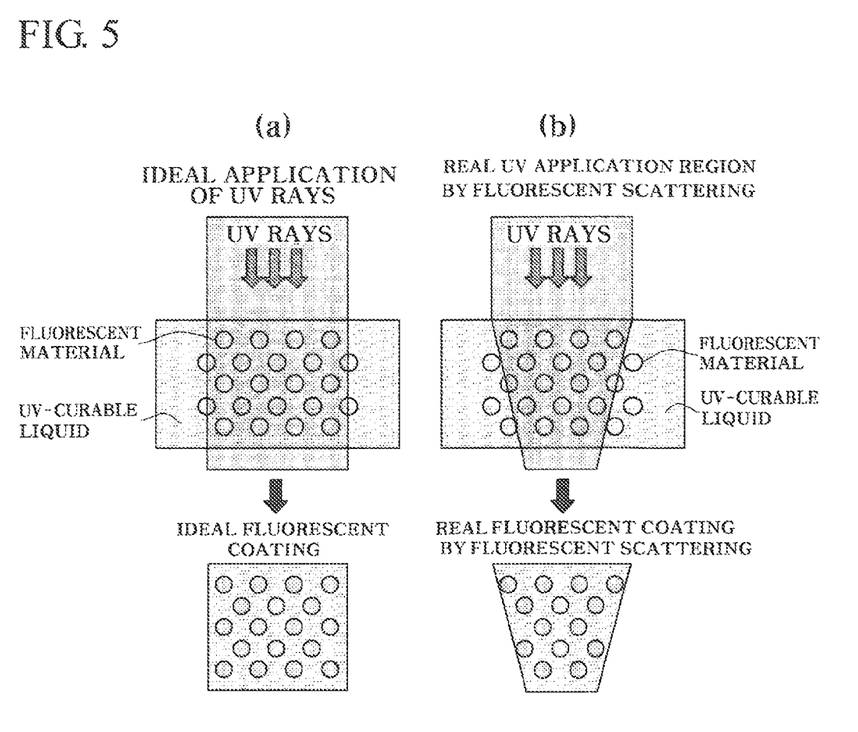
FIG. 5 is a diagram for explaining a problem occurring when one-side exposure is performed on a photocurable liquid containing a fluorescent material according to the conventional art.

In the procedure shown in FIG. 3, double-side exposure is performed rather than conventional one-side exposure for the reasons explained below. FIG. 5 is a diagram for explaining a problem occurring when one-side exposure is performed on a photocurable liquid containing a fluorescent material. FIG. 5 (a) shows the forming of an ideal fluorescent coating when the portion exposed to UV irradiation is cured. However, when conventional one-side exposure is performed for the fluorescent coating, radiated UV rays do not actually thoroughly reach the photocurable liquid, and thus may be absorbed and scattered by the fluorescent material as shown in FIG. 5 (b). In this case, because the UV rays are not uniformly transferred to the area opposite the light source, some areas coated with the material containing the fluorescent material are not cured. The uncured portion is removed during the developing process, and thus a desired coating uniformity cannot be obtained. That is, a desired color may not be obtained because the fluorescent coating is not uniform on the sidewalls of the LEDs. For example, when blue light emitted from a blue LED and yellow light obtained from a yellow fluorescent material are combined to form white light, the bluish white light may be obtained because the sidewall of LED emits only blue light. Therefore, the fluorescent coating through a one-side exposure method may increase the failure rate and manufacturing costs.

Figure 6:
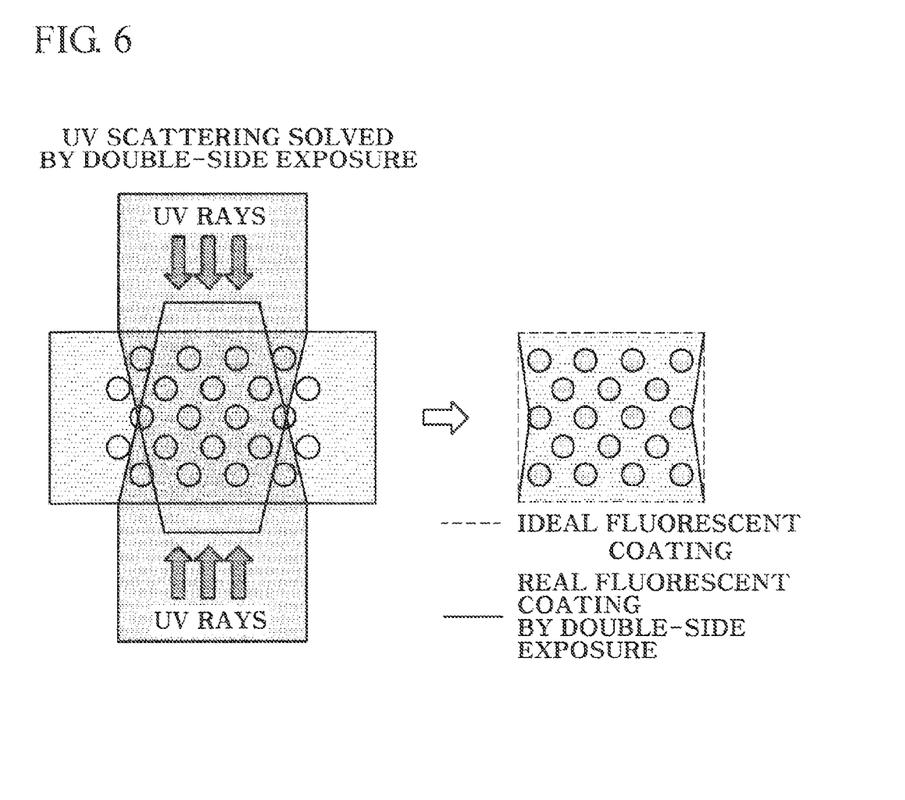
FIG. 6 is a diagram illustrating an example of a fluorescent coating formed by introducing a double-side exposure method according to an embodiment of the present invention.

FIG. 6 is a diagram illustrating an example of a fluorescent coating formed by introducing a double-side exposure method according to an embodiment of the present invention. Referring to FIG. 6, UV exposure is performed on both surfaces of fluorescent coating: Thereby, it is possible to reduce an influence of UV absorption and scattering by the fluorescent material and to achieve approximately ideal fluorescent coating. Fluorescent coating through a double-side exposure method may be applied to both sides of a transparent or translucent substrate through which UV rays can pass, as mentioned above. Actually, LED chips implemented on wafer are frequently arranged on blue tape in arrays of hundreds to thousands and transferred to the packaging process. According to some embodiments of present invention, fluorescent coating may be applied to LED chips arranged on the blue tape. In this case, the LED chips arranged on the blue tape need not be separated from the blue tape, and the exposure process may be performed on the LED chips mounted on the blue tape.

Figure 7:
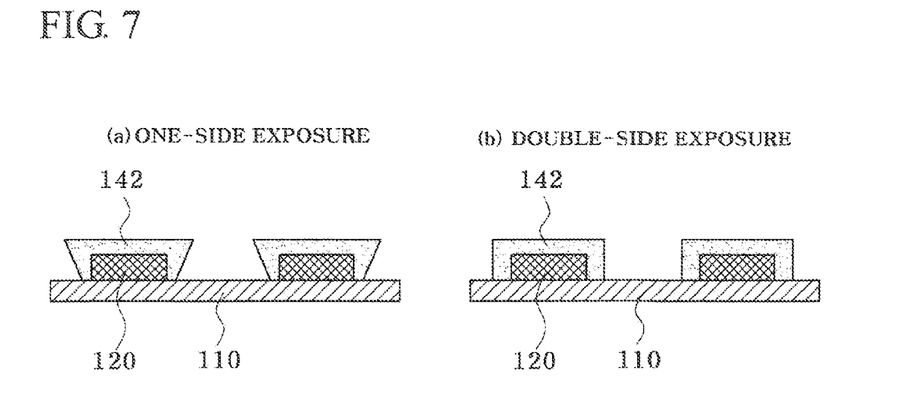
FIG. 7 is a cross-sectional view comparing (a) the result of fluorescent coating through a one-side exposure method with (b) the result of fluorescent coating through a double-side exposure method according to an embodiment of the present invention.

FIG. 7 is a cross-sectional view comparing (a) the result of fluorescent coating through a one-side exposure method with (b) the result of fluorescent coating through a double-side exposure method according to an embodiment of the present invention. Referring to FIG. 7(a), applying UV light only to the upper surface of substrate 110 may result in uneven fluorescent coating 142 around the LEDs 120 because of the influence of UV absorption and scattering by the fluorescent material, as described above in FIG. 5. On the other hand, referring to FIG. 7 (b), applying UV light to the both upper and lower surfaces of substrate 110 may result in uniform fluorescent coating 142 by reducing the influence of UV absorption and scattering by the fluorescent material.

Figure 8:
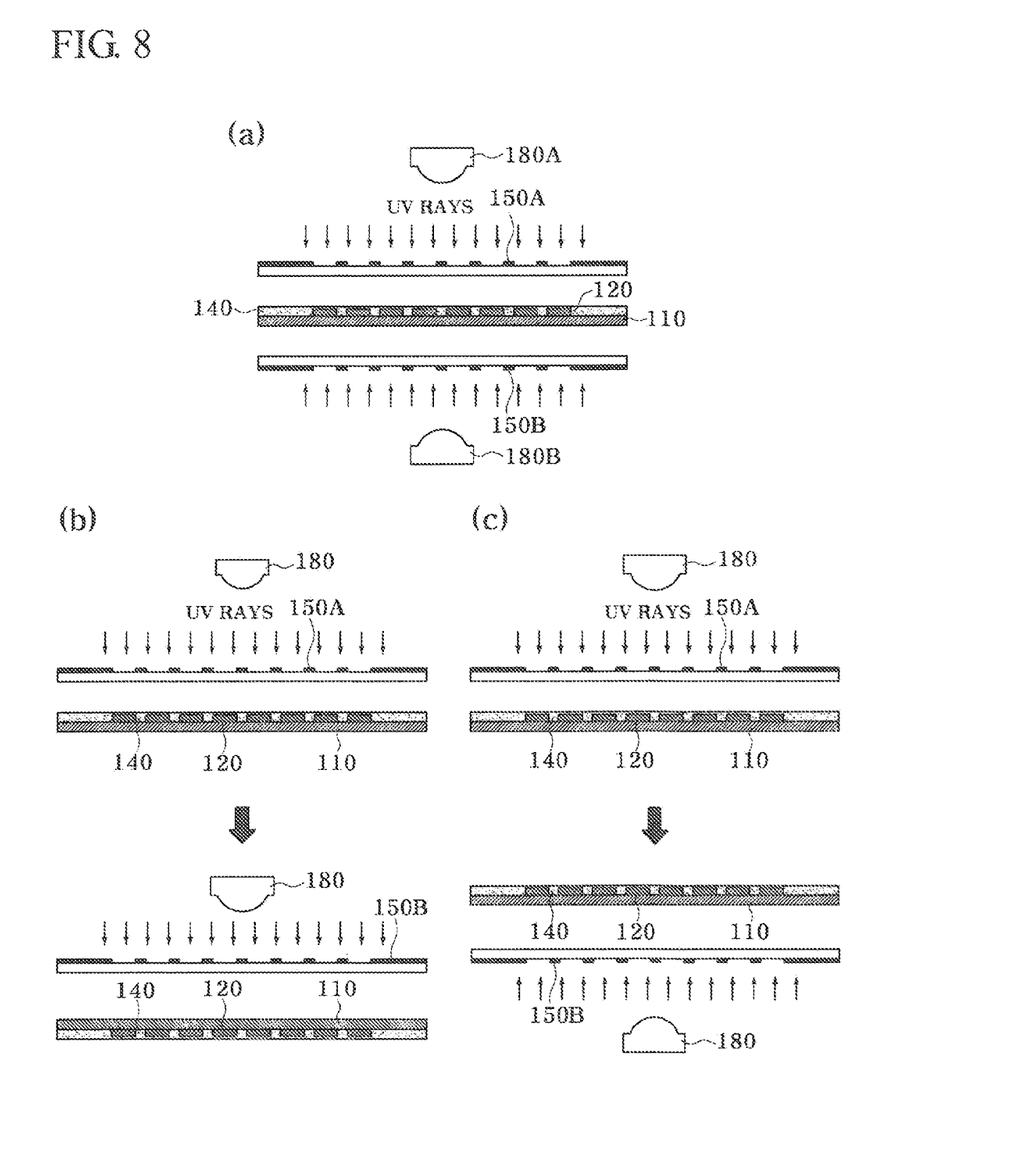
FIG. 8 is a diagram illustrating various exemplary embodiments of a double-side exposure method according to the present invention.

FIG. 8 is a diagram illustrating various exemplary embodiments of a double-side exposure method according to the present invention. Referring to FIG. 8 (a), as described above, a double-side exposure method may be performed by respectively positioning exposure heads 150A and 150B above and below the upper and lower surfaces of the substrate 110, and performing exposure to the upper and lower surfaces of the substrate 110 simultaneously or sequentially. For example, applying energy may include a method of simultaneously operating each of the exposure heads 150A and 150B, a method of operating one of the exposure heads 150A and 150B after the other one, and a method of alternately operating the exposure heads 150A and 150B. The exposure may be performed by symmetrically aligning masks having mirror images to each other on each surface of the substrate.

Alternatively, as shown in FIG. 8 (b) or (c), the exposure process may be performed by sequentially exposing the substrate 110 using only one exposure head 150. Here, the exposure may be performed to primarily expose one of the upper surface (the surface having LED chips thereon) and the lower surface of the substrate 110 by an exposure head placed over one surface of the substrate 110, and then, to secondarily expose the other surface of the substrate 110 by rotating the substrate 110 such that the other surface of the substrate 110 faces the exposure head 150 or by moving the exposure head 150 over the other surface of the substrate 110. Also, the exposure may be performed by aligning a first mask 150 over one surface of the substrate 110 to perform a primary exposure, and then aligning a second mask 150 having a mirror image to the first mask over the other surface of the substrate 110 to perform a secondary exposure.

When the energy of the same intensity is applied to both surfaces of the substrate 110, compared to the energy applied to the upper surface, the energy applied to the lower surface may have loss of energy because the energy should pass through the substrate 110. Considering the loss of energy due to the transmission through the substrate 110, the application of energy may be performed by applying more energy to the lower surface of the substrate 110 than to the upper surface having the plurality of LEDs 150 positioned thereon, for uniform coating. Applying more energy may be achieved by increasing energy intensity itself or increasing exposure time.

When applying the double-side exposure method as mentioned above, it is possible to apply uniform fluorescent coating to each of the LED chips arranged on a transparent or translucent substrate. In addition to applying the double-side exposure method, by adjusting a pattern of a mask, the control of the shape and thickness of the fluorescent coating can be achieved.

Figure 9:
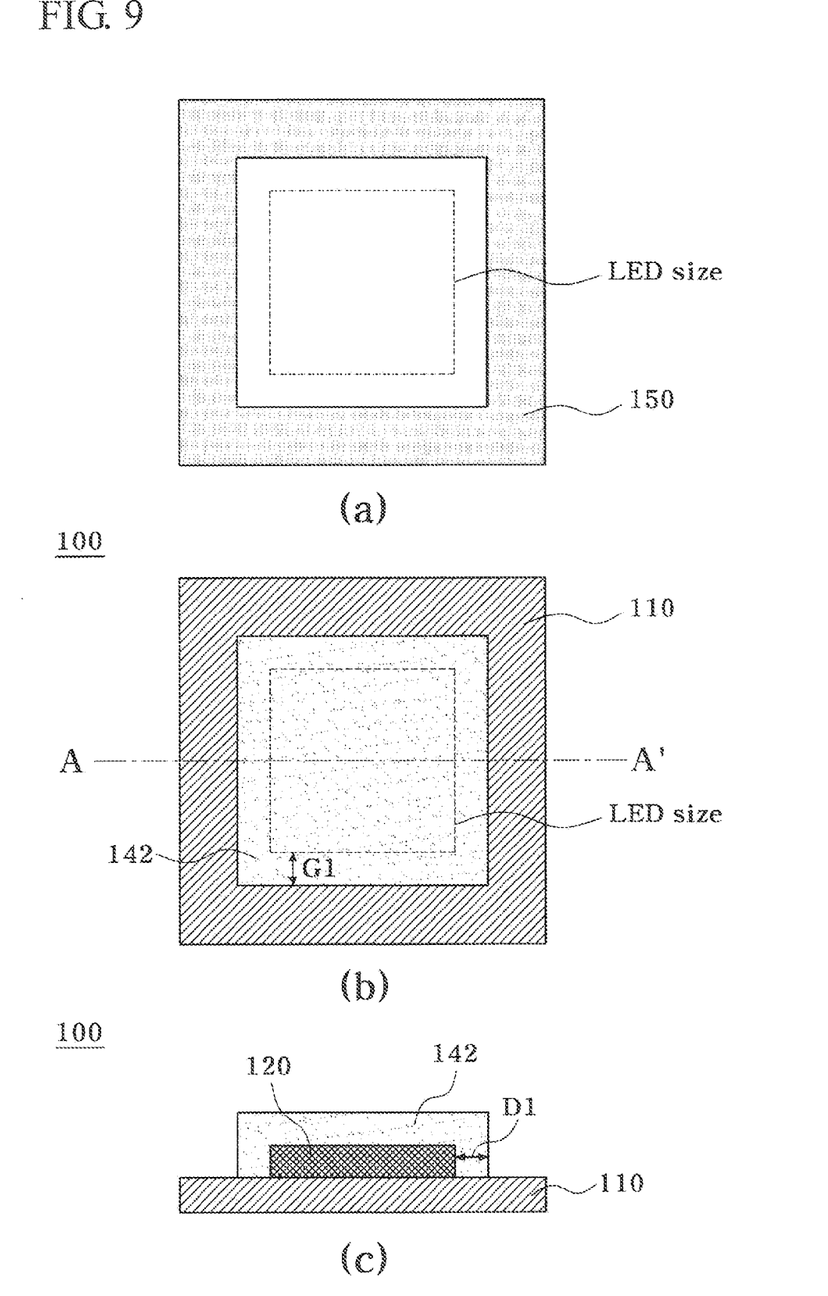
FIGS. 9 to 11 are diagrams for explaining that the shape of a fluorescent coating 142 and the thickness of the fluorescent coating on the sidewall of an LED 120 may be controlled by a pattern of a mask 150.
Figure 10:
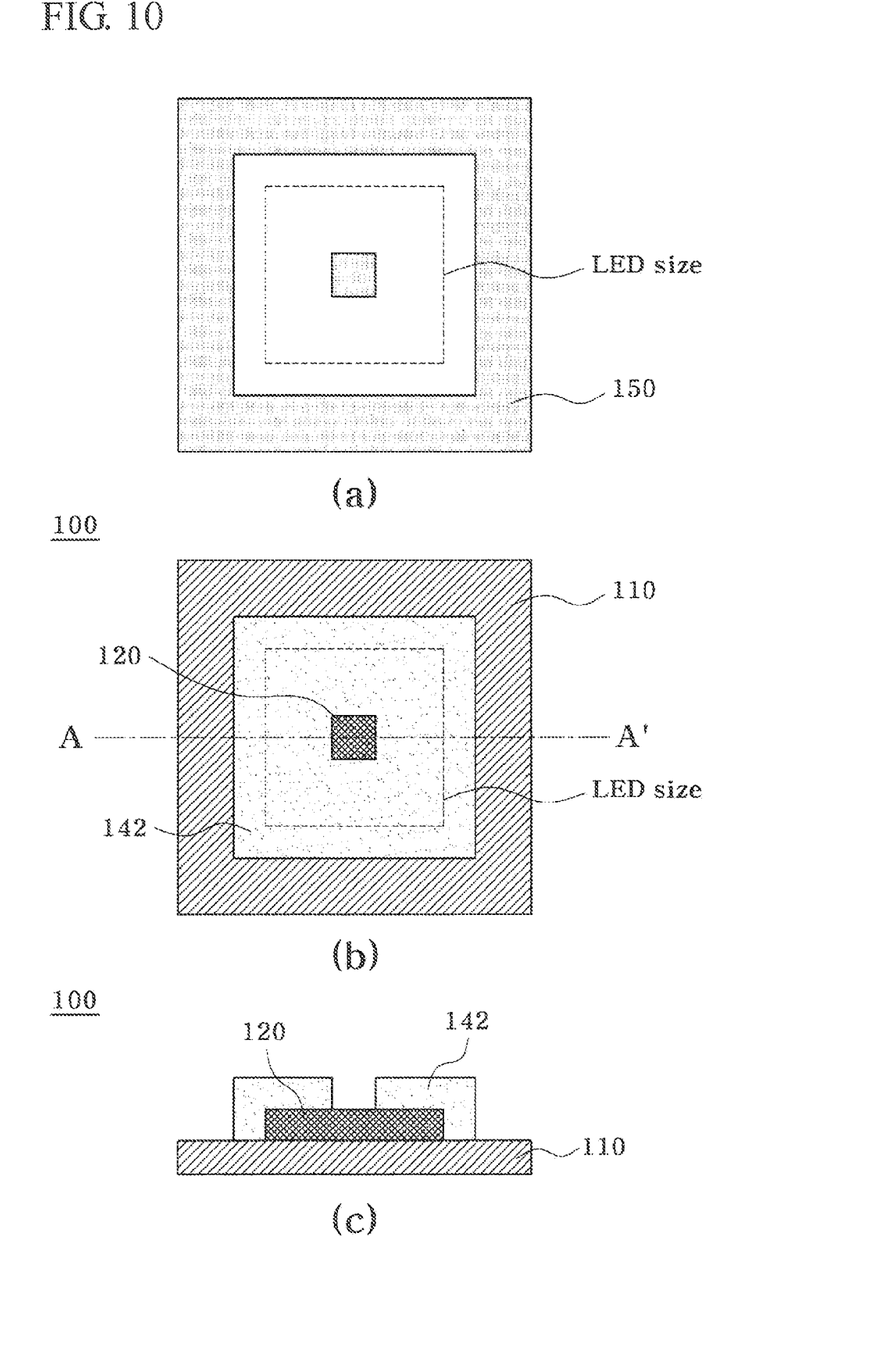
Figure 11:
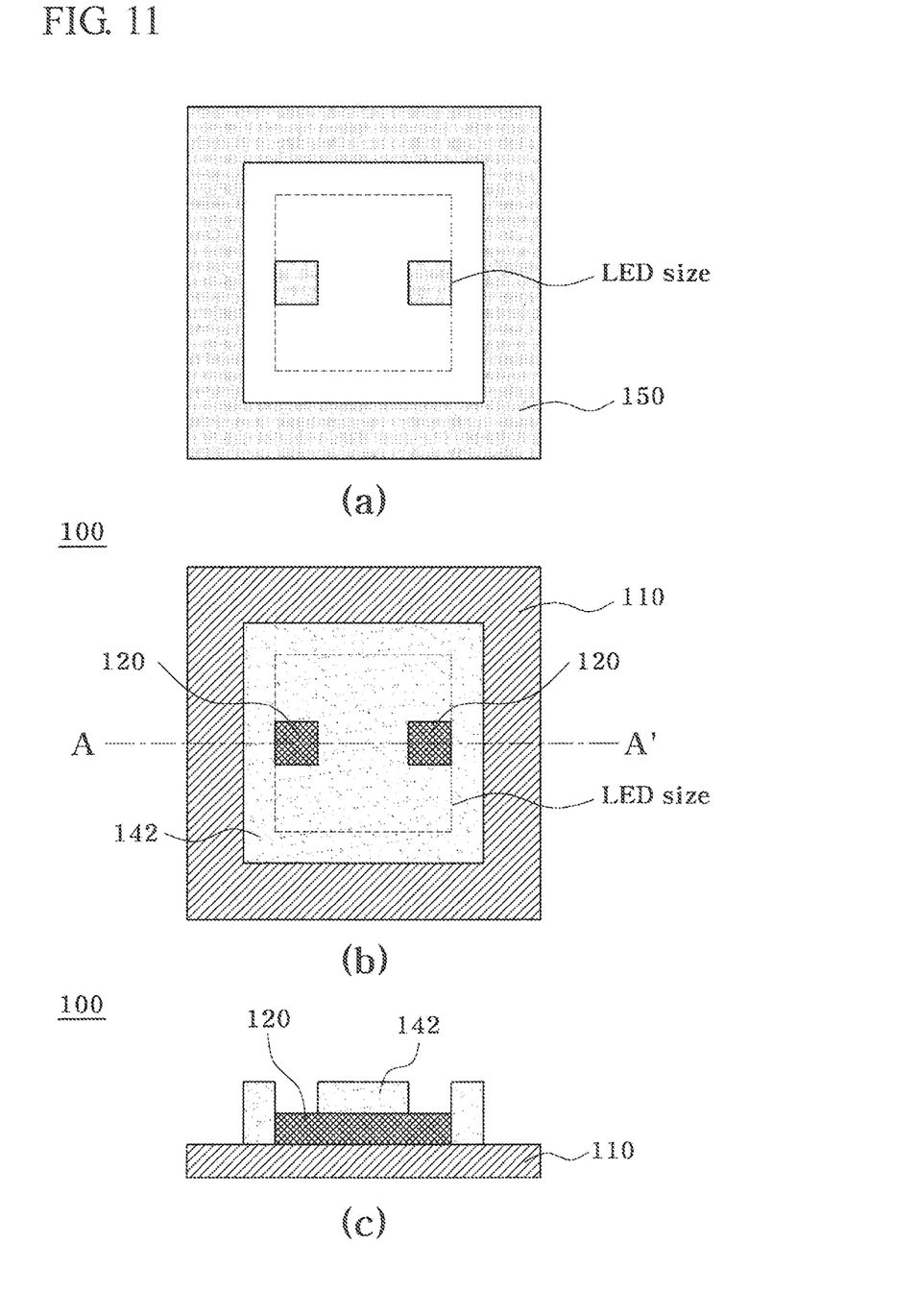

FIGS. 9 to 11 are diagrams for explaining that the shape of fluorescent coating 142 and the thickness of fluorescent coating 142 on the sidewalls of the LEDs 120 may be controlled by a pattern of the mask 150. In FIGS. 9 to 11, (a) shows a pattern of mask 150, and (b) and (c) respectively show a layout and cross-sectional view (taken along a line A-A' in (b)) of an LED light source 100 formed when using the mask 150 as shown in (a).

When using the mask 150 shown in FIG. 9 (a), a fluorescent coating 142 is formed to fully cover the top surface and sidewalls of the LEDs 120 as shown in FIGS. 9 (b) and (c). In the drawings, the thickness of the fluorescent coating 142 on the sidewalls of the LEDs 120 is determined by the pattern of the mask 150. For example, assuming that the curable liquid 140 does not swell or shrink during the curing process, the thickness D1 of the fluorescent coating 142 on the sidewalls of the LEDs 120 is the same as the horizontal distance G1 between the LEDs 120 and the mask 150. Therefore, when coating the LEDs 120 in accordance with the present invention, the thickness of the fluorescent coating 142 on the sidewalls of the LEDs 120 can be easily controlled by adjusting the distance between the LEDs 120 and the mask 150.

When using the mask 150 shown in FIGS. 10(a) and 11(a), the fluorescent coating 142 is formed over the area other than a portion of the top surface of the LEDs 120, as shown in (b) and (c) of FIGS. 10 and 11. In FIGS. 10 and 11, some of the remaining area on which the fluorescent coating 142 is not formed may be used for contact with bonding wire (not shown) in a subsequent process.

Figure 12:
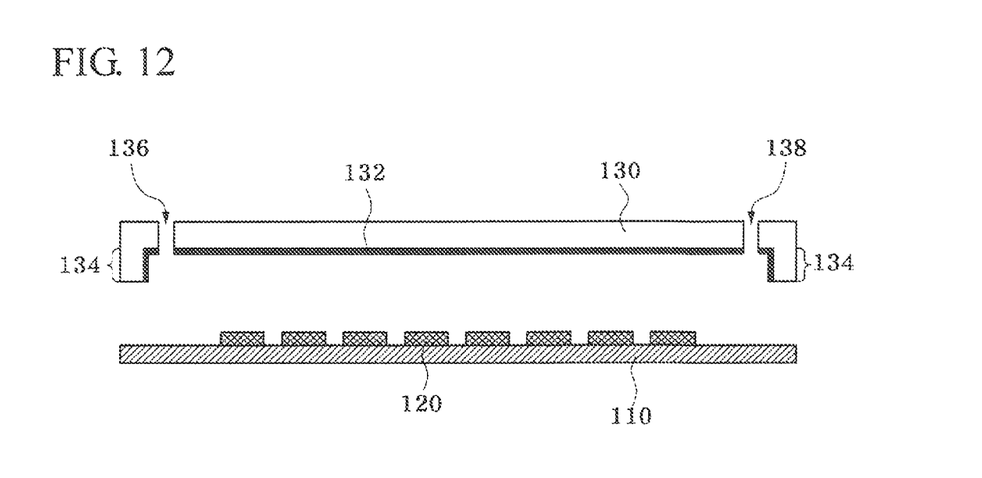
FIGS. 12 to 15 are diagrams describing each procedure of an LED coating method according to another embodiment of the present invention.

FIGS. 12 to 15 are diagrams describing each procedure of an LED coating method according to another embodiment of the present invention. Referring to FIG. 12, a substrate 110, a plurality of LEDs 120 arranged on the substrate 110, and a board 130 are prepared.

A variety of substrates can be used as the substrate 110, and a variety of LEDs can be used as the plurality of LEDs 120. The board 130 is transparent in whole or in part. The board 130, for example, may be a glass board or a plastic board. Preferably, an anti-adhesive layer 132 is formed on the bottom surface of the board 130, that is, on the surface facing the plurality of LEDs 120. The anti-adhesive layer 132 prevents the fluorescent coating 142 obtained by curing of the curable liquid 140 from attaching to the board 130, and therefore, facilitates the separation of the board 130 and the fluorescent coating 142. The anti-adhesive layer 132, for example, may be an oxygen permeable layer. An oxygen permeable layer comprises a substance which can transmit oxygen through micro pores. Polydimethylsiloxane (PDMS), for example, may be used as the oxygen permeable layer. When using the oxygen permeable layer, the curing of a photoresist is suppressed by the oxygen supplied onto the surface of oxygen permeable layer, so that the adhesion of the oxygen permeable layer to the fluorescent coating 142 can be prevented. The anti-adhesive layer 132, for example, can be a hydrophobic coating, e.g. Teflon.

Figure 13:
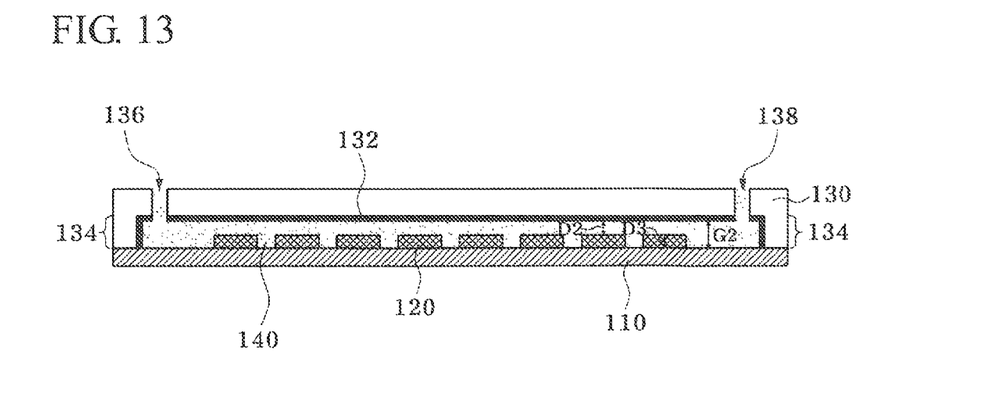

The board 130 may be equipped with a spacer 134 that determine a distance between the board 130 and the substrate 110 in the following process. The spacer 134 may be formed integrally with the board 130 as shown in FIGS. 12 to 15, or formed separately with the board 130 unlike the drawings. The spacer 134 may be dispensable if there are other means to precisely control the distance between the board 130 and the substrate 110. The board 130 may include an inlet 136 and an outlet 138. The inlet 136 corresponds to a hole into which a curable liquid 140 is injected, and the outlet 138 corresponds to a hole from which internal air, etc. is released during the injection of the curing liquid 140 in the following process (the process of FIG. 13). The inlet 136 and outlet 138 may be formed as shown in FIG. 13, or otherwise formed in the spacer 134, formed in the substrate 110, or omitted.

Referring to FIG. 13, the curable liquid 140 may be interposed between the substrate 110 and the board 130 arranged in parallel to each other, with the plurality of LEDs 120 sandwiched therebetween. The curable liquid 140 contains a fluorescent material. A variety of fluorescent materials may be used. In the following process, a thickness of the fluorescent coating 142, especially the thickness of the fluorescent coating 142 on the top surface of the LEDs, is determined by the distance between the substrate 110 and the board 130. Assuming that the curable liquid does not swell or shrink during the curing process, the thickness D2 of the fluorescent coating 142 is equal to (G2–D3), where G2 refers to the distance between the substrate 110 and the board 130 and D3 refers to the thickness of the LEDs. Therefore, when the LEDs 120 are coated in accordance with the present invention, the thickness of the fluorescent coating 142 can be easily controlled by adjusting the distance between the substrate 110 and the board 130.

In the exemplary embodiment as shown in FIG. 13, the process of interposing the curable liquid 140 between the substrate 110 and the board 130 may include the step of arranging the board 130 on the substrate 110 and the step of injecting the curable liquid 140 into the space between the substrate 110 and the board 130 through the inlet 136. In this case, the space between the substrate 110 and the board 130 is surrounded by the board 130, the substrate 110, and the spacer 134, and therefore contacts the outside only by the inlet 136 and the outlet 138.

Unlike FIG. 13, there are various methods of interposing the curable liquid 140 between the substrate 110 and the board 130. For example, it is possible to immerse the substrate 110 in the curable liquid 140, and then to arrange the board 130 on the substrate 110. Otherwise, it is possible to spray the curable liquid 140 onto the substrate 110, and then to arrange the board 130 on the substrate 110. In this case, the inlet 136 and outlet 138 may not be required, and the spacer 134 may not need to surround all sides of the space between the board 130 and the substrate 110.

Figure 14:
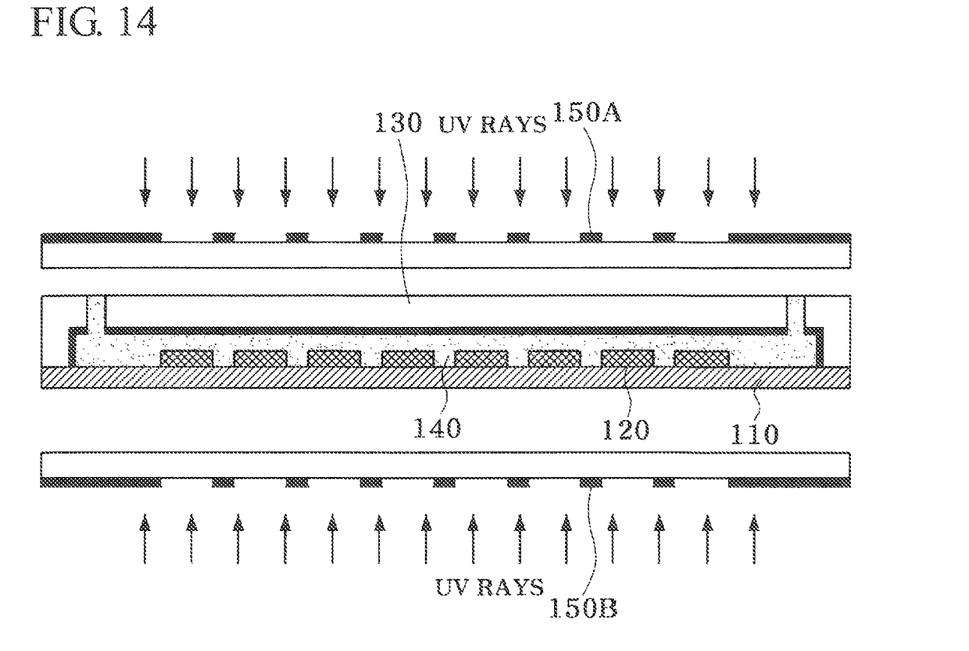
Figure 15:
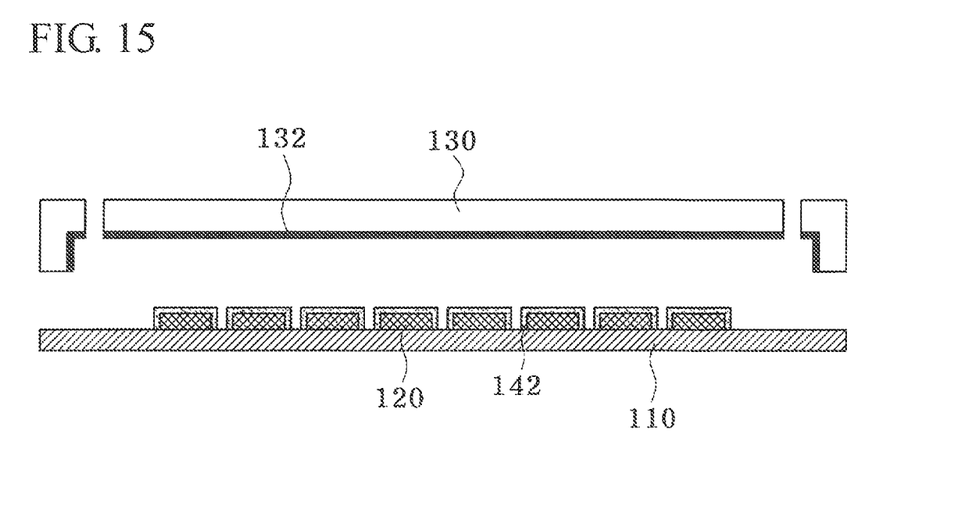

Referring to FIG. 14, the curable liquid 140 is selectively exposed by a double-side exposure method. The double-side exposure method may be performed simultaneously or sequentially on both the upper and lower surfaces of the substrate 110, as shown in FIG. 14. A mask 150A and a mask 150B are arranged in mirror images to each other, and therefore, the same areas around the LEDs 120 can be exposed.

FIG. 14 shows an example of selectively providing light using separate masks 150A and 150B on the curable liquid 140, however, any other method can be used, as long as light can be selectively provided onto the curable liquid 140. For example, the masks 150 can be formed on the board 130 itself.

The drawings show an example of applying UV light, but not limited to UV light, a variety of energy sources such as light of various wavelengths or electron beams can be used. While the drawings show an example of using a negative photoresist as a curable liquid 140, a positive photoresist may be used. When a positive photoresist is used, unlike the example shown in the drawings, the masks 150A and 150B should be fabricated to block the light from the regions at which the fluorescent coating 142 is to be formed, and to transmit the light to the other regions.

Figure 16:
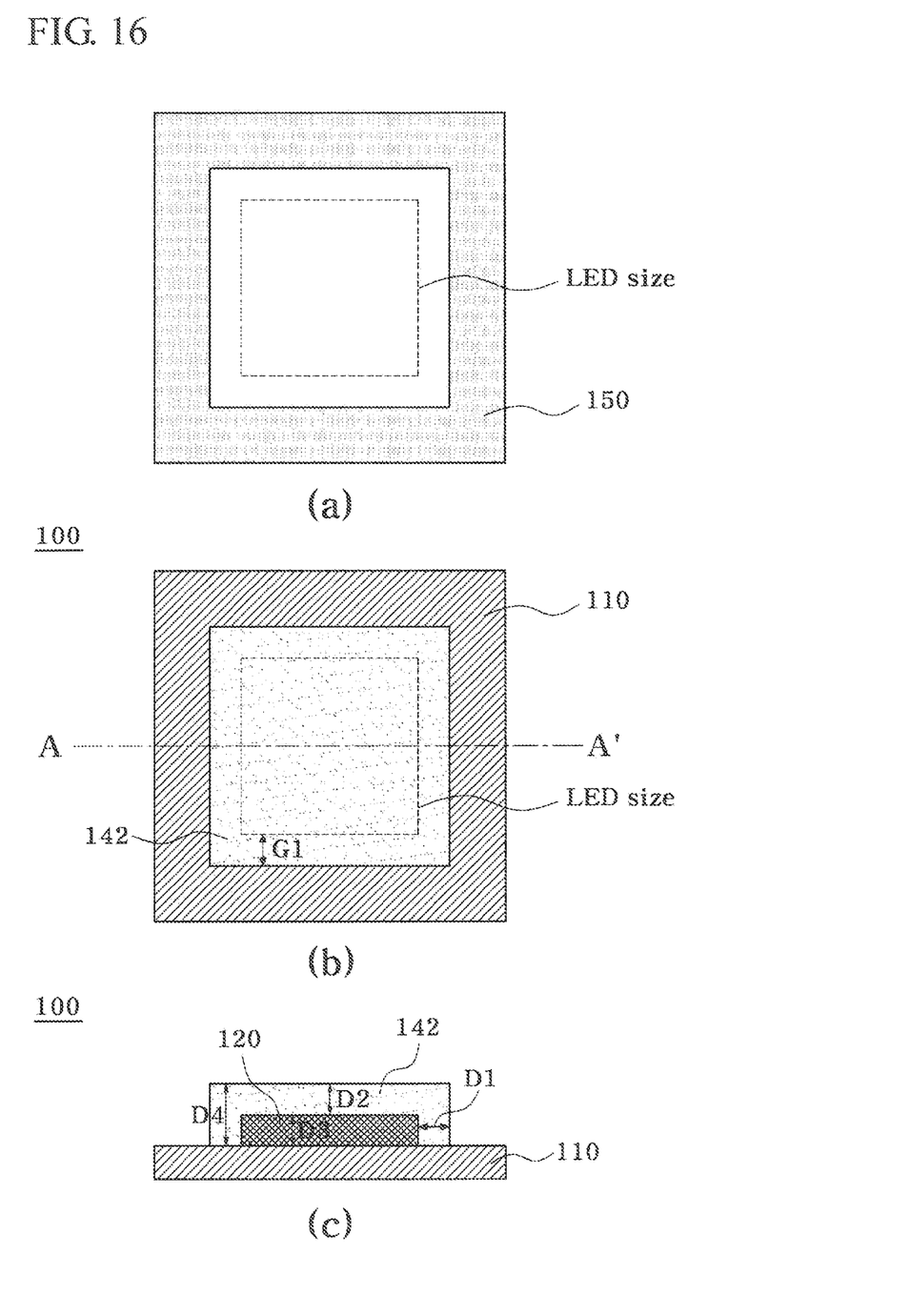
FIG. 16 is a diagram for explaining that the thickness of a fluorescent coating 142 according to the embodiment shown in FIGS. 12 to 15 can be controlled.

FIG. 16 is a diagram for explaining that the thickness of the fluorescent coating 142 according to the embodiment shown in FIGS. 12 to 15 can be controlled. In FIG. 16, (a) shows a pattern of the mask 150, and (b) and (c) respectively show a layout and cross-sectional view (along a line A-A') of an LED light source formed using the mask 150 shown in (a).

Referring to FIG. 16, the thickness of the fluorescent coating 142 on the sidewalls of the LEDs is determined by the pattern of the mask 150. As mentioned above, assuming that the curable liquid 140 does not swell or shrink during the curing process, the thickness D1 of the fluorescent coating 142 on the sidewalls of the LEDs 120 is the same as the horizontal distance G1 between the LEDs 120 and the mask 150. Therefore, when the LEDs 120 are coated in accordance with the present invention, the thickness of the fluorescent coating 142 on the sidewalls of the LEDs 120 can be easily controlled by adjusting the horizontal distance between the LEDs 120 and the mask 150.

In addition, the thickness of the fluorescent coating 142 on the top surface of the LEDs is determined by the distance between the substrate 110 and the board 130. As mentioned above, assuming that the curable liquid 140 does not swell or shrink during the curing process, the thickness D2 of the fluorescent coating 142 is equal to (G2–D3), where G2 refers to a distance between the substrate 110 and the board 130, and D3 refers to a thickness of the LEDs. Therefore, when the LEDs 120 are coated in accordance with the present invention, the thickness of the fluorescent coating 142 can be easily controlled by adjusting the distance between the substrate 110 and the board 130. Also, as easily understood from the drawings, the fluorescent coating 142 of uniform thickness can be obtained by using the board 130.

Furthermore, the thickness D4 of the fluorescent coating 142 in FIG. 16 is determined by the distance between the substrate 110 and the board 130. For example, assuming that the curable liquid 140 does not swell or shrink during the curing process, the thickness D4 of the fluorescent coating 142 is the same as the distance G2 between the substrate 110 and the board 130. Therefore, when the LEDs are coated in accordance with the present invention, the thickness D4 of the fluorescent coating 142 can be easily controlled by adjusting the distance between the substrate 110 and the board 130.

The coating method according to the embodiment shown in FIGS. 12 to 15 has advantages that the method enables the thickness of the coating formed on the top surface of the LEDs to be controlled and a uniform coating thickness to be obtained, in addition to the advantage of the LED coating method according to the embodiment shown in FIGS. 1 to 4.

While the coating of this embodiment relates to fluorescent coating according, the present invention is not limited to fluorescent coating. Therefore, the coating method may be applied to the coating of other materials, for example, a material containing filler particles, as long as the material causes absorption and scattering.

According to the LED coating method described above, the problem of non-uniform curing of a curable liquid placed in an area opposite the energy application part caused by performing a one-side exposure method can be solved by introducing the double-side exposure method. Also, the LED coating method described above enables a uniform fluorescent coating to be easily and inexpensively formed around a plurality of LED chips, and the desired coating thickness to be easily controlled. In addition, production yield may be increased by shortening curing time. Therefore, a fluorescent-coated LED manufactured through the LED coating method described above can radiate uniform color in all directions around the LED chip. Consequently, the coating method according to the embodiment of present invention can be applied to high value-added products such as BLU requiring high color uniformity and lighting apparatus. Moreover, because a fluorescent layer is directly coated on an LED chip, a smaller light source can be manufactured, and therefore, it is easy to design a secondary optical system such as a lens.

The foregoing is illustrative of the present disclosure and is not to be construed as limiting thereof. Although numerous embodiments of the present disclosure have been described, those skilled in the art will readily appreciate that many modifications are possible in the embodiments without materially departing from the novel teachings and advantages of the present disclosure. Accordingly, all such modifications are intended to be included within the scope of the present disclosure as defined in the claims. Therefore, it is to be understood that the foregoing is illustrative of the present disclosure, which is not to be construed as limited to the specific embodiments disclosed, and that modifications to the disclosed embodiments, as well as other embodiments, are intended to be included within the scope of the appended claims. The present disclosure is defined by the following claims, with equivalents of the claims to be included therein.

What is claimed is:

1. A method of coating a light emitting diode (LED), comprising:
    preparing a substrate on which a plurality of LEDs are arranged;
    applying a curable liquid containing a fluorescent material onto the substrate and the plurality of LEDs; and
    selectively applying light to the substrate to which the curable liquid is applied, to thereby pattern the curable liquid, wherein the application of the light includes:
        aligning a first mask on an upper surface of the substrate and a second mask on a lower surface of the substrate, and
        directly applying the light to the upper and lower surfaces of the substrate so that the upper surface is directly exposed to the light through the first mask and the lower surface is directly exposed to the light through the second mask.

2. The method according to claim 1, wherein the patterning is performed to form a fluorescent coating of a predetermined thickness on each surface of the plurality of LEDs.

3. The method according to claim 1, wherein the application of the light is performed by placing first and second light sources above and below the upper and lower surfaces of the substrate, respectively, to apply the light to the upper and lower surfaces of the substrate simultaneously or sequentially.

4. The method according to claim 1, wherein the application of the light is performed using a light source located over one surface of the substrate, and then performed by rotating the substrate such that the other surface of the substrate faces the light source or by moving the light source over the other surface of the substrate.

5. The method according to claim 1, wherein the application of the curable liquid is performed by disposing the substrate and a board parallel to each other, with the plurality of LEDs sandwiched therebetween, and introducing the curable liquid between the substrate and the board.

6. The method according to claim 1, wherein the application of the light is performed by applying higher intensity light to the lower surface of the substrate than to the upper surface having the plurality of LEDs positioned thereon.

7. The method of claim 1, wherein the first and second masks have mirror images to each other.

8. A method of coating a light emitting diode (LED), comprising:
    preparing a substrate having a first surface on which a plurality of LEDs are arranged;
    applying a curable liquid containing a fluorescent material onto the first surface of the substrate and the plurality of LEDs;
    directly applying light to the first surface of the substrate through a first mask to pattern the curable liquid on the first surface; and
    directly applying the light to a second surface of the substrate which is opposite to the first surface of the substrate through a second mask having a mirror image to the first mask.

* * * * *